United States Patent
Okabe et al.

(10) Patent No.: US 9,663,873 B2
(45) Date of Patent: May 30, 2017

(54) CEILING PORTION FOR EPITAXIAL GROWTH APPARATUS

(71) Applicant: Applied Materials, Inc., Santa Clara, CA (US)

(72) Inventors: Akira Okabe, Ohmura (JP); Yoshinobu Mori, Ohmura (JP)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/668,697

(22) Filed: Mar. 25, 2015

(65) Prior Publication Data

US 2015/0252493 A1 Sep. 10, 2015

Related U.S. Application Data

(63) Continuation of application No. 13/934,708, filed on Jul. 3, 2013.

(30) Foreign Application Priority Data

Mar. 14, 2013 (JP) .................................. 2013-052479

(51) Int. Cl.
*C30B 25/08* (2006.01)
*C30B 25/12* (2006.01)
(Continued)

(52) U.S. Cl.
CPC .............. *C30B 25/08* (2013.01); *C30B 25/12* (2013.01); *C30B 25/165* (2013.01); *C30B 29/06* (2013.01)

(58) Field of Classification Search
CPC ....... Y10T 117/10; C30B 25/08; C30B 25/12; C30B 25/165; C30B 29/06
See application file for complete search history.

(56) References Cited

U.S. PATENT DOCUMENTS 6,099,648 A * 8/2000 Anderson ............... C30B 25/08
118/715
6,869,485 B2 * 3/2005 Halpin ................ C23C 16/4584
118/715
(Continued)

FOREIGN PATENT DOCUMENTS

JP 2000-331939 A 11/2000
JP 2003-197719 A 7/2003
(Continued)

OTHER PUBLICATIONS

International Search Report and Written Opinion dated Jul. 25, 2014 for PCT/US2014/026589.

(Continued)

*Primary Examiner* — Robert M Kunemund
*Assistant Examiner* — Hua Qi
(74) *Attorney, Agent, or Firm* — Patterson + Sheridan, LLP

(57) ABSTRACT

A ceiling portion for use in a processing apparatus and an epitaxial growth apparatus having the ceiling portion are disclosed herein. In one embodiment the ceiling portion includes a ring shaped support and a ceiling plate. The ring shaped support includes an inner surface having a first slope portion decreasing from a top surface of the ring shaped support towards a center of the ring shaped support and a protrusion, protruding from the inner surface, having a second slope portion decreasing in a protruding direction towards the center of the ring shaped support. The ceiling plate is coupled to the support. In another embodiment, the first slope portion and the second slope portion meet at a point, wherein an angle formed by the first slope portion and the second slope portion is less than 90 degrees.

13 Claims, 23 Drawing Sheets

(51) Int. Cl.
*C30B 25/16* (2006.01)
*C30B 29/06* (2006.01)

(56) References Cited

U.S. PATENT DOCUMENTS

| | | |
|---|---|---|
| 2003/0178145 A1 | 9/2003 | Anderson et al. |
| 2004/0241992 A1 | 12/2004 | Kono et al. |
| 2006/0249695 A1 | 11/2006 | Choi |
| 2007/0281084 A1 | 12/2007 | Hirosawa et al. |

FOREIGN PATENT DOCUMENTS

| | | |
|---|---|---|
| JP | 2004-134625 A | 4/2004 |
| JP | 2004-200603 | 7/2004 |
| JP | 2005-197380 A | 7/2005 |
| JP | 2005260095 A | 9/2005 |
| JP | 2007-294492 A | 11/2007 |
| JP | 2012222301 A | 11/2012 |
| WO | WO-2013016266 A1 | 1/2013 |

OTHER PUBLICATIONS

International Search Report and Written Opinion dated Jul. 22, 2014 for PCT/US2014/026616.

\* cited by examiner

CEILING PORTION FOR EPITAXIAL GROWTH APPARATUS

CROSS-REFERENCE TO RELATED APPLICATIONS

This application is a continuation of U.S. patent application Ser. No. 13/934,708 filed on Jul. 3, 2013, which claims priority to Japanese Patent Application Number 2013-052479 filed on Mar. 14, 2013, both of which are hereby incorporated by reference in its entirety.

BACKGROUND OF THE INVENTION

Field of the Invention

The present invention relates to a film forming method using epitaxial growth and an epitaxial growth apparatus.

Background Art

At present, as an epitaxial growth apparatus for causing an epitaxial film to grow on a substrate using epitaxial growth, an apparatus including a process chamber and a rotatable substrate support disposed in the process chamber and configured to rotate a substrate about a rotation axis is known in which a reactant gas is introduced to the substrate in a direction parallel to the substrate to form a film on the substrate on the substrate support.

In such an epitaxial growth apparatus, there is currently a need for an increase in growth rate. However, it is not preferable that a large amount of source gas is included in the reactant gas so as to further increase the growth rate, for example, because an increase in the film formation cost or an increase in the number of particles is caused.

In epitaxial growth, when the thickness of a boundary layer (at a position at which the flow rate is 99% of the flow rate of the main stream of the reactant gas flow) on the surface of a substrate decreases, it is known that an increase in growth rate is expected. On the other hand, when the thickness of the boundary layer simply decreases, a flow in which the reactant gas escapes toward the circumferential edge of the substrate on the surface of the substrate is formed and it is thus difficult to adjust a film thickness distribution or a resistivity distribution.

SUMMARY OF THE INVENTION

In one embodiment, a ceiling portion for use in a processing apparatus is disclosed herein. The ceiling portion includes a ring shaped support and a ceiling plate. The ring shaped support includes an inner surface and a protrusion. The inner surface has a first slope portion. The inner surface decreases from a top surface of the ring shaped support towards a center of the ring shaped support. The protrusion extends from the inner surface. The protrusion includes a second slope portion decreasing in a protruding direction towards the center of the ring shaped support. The ceiling plate is coupled to the support.

In another embodiment, a ceiling portion for use in a processing apparatus is disclosed herein. The ceiling portion includes a ring shaped support and a ceiling plate. The ring shaped support includes an inner surface and a protrusion. The inner surface has a first slope portion. The inner surface decreases from a top surface of the ring shaped support towards a center of the ring shaped support. The protrusion protrudes from the inner surface. The protrusion includes a second slope decreasing in a protruding direction towards the center of the ring shaped support. The first slope portion and the second slope portion meet at a point, wherein an angle formed by the first slope portion and the second slope portion is less than 90 degrees. The ceiling portion is coupled to the support. In another embodiment, an epitaxial growth apparatus is disclosed herein. The epitaxial growth apparatus includes a reaction chamber, a substrate mounting portion, and a support. The reaction chamber includes a ceiling portion having a ring shaped support and a ceiling plate. The ring shaped support includes an inner surface having a first slope portion decreasing from a top surface of the ring shaped support towards a center of the ring shaped support and a protrusion having a second slope portion decreasing in a protruding direction towards the center of the ring shaped support. The ceiling plate is coupled to the support. The substrate mounting portion is configured to support a substrate. The support is configured to support the ceiling portion such that the ceiling plate is separated from a ceiling surface of the epitaxial growth apparatus by a distance of at least 10 nm.

DETAILED DESCRIPTION OF THE INVENTION

Hereinafter, an epitaxial growth apparatus according to an embodiment of the present invention and a film forming method using epitaxial growth which is performed using the epitaxial growth apparatus will be described.

Configuration of Epitaxial Growth Apparatus

Figure 1:
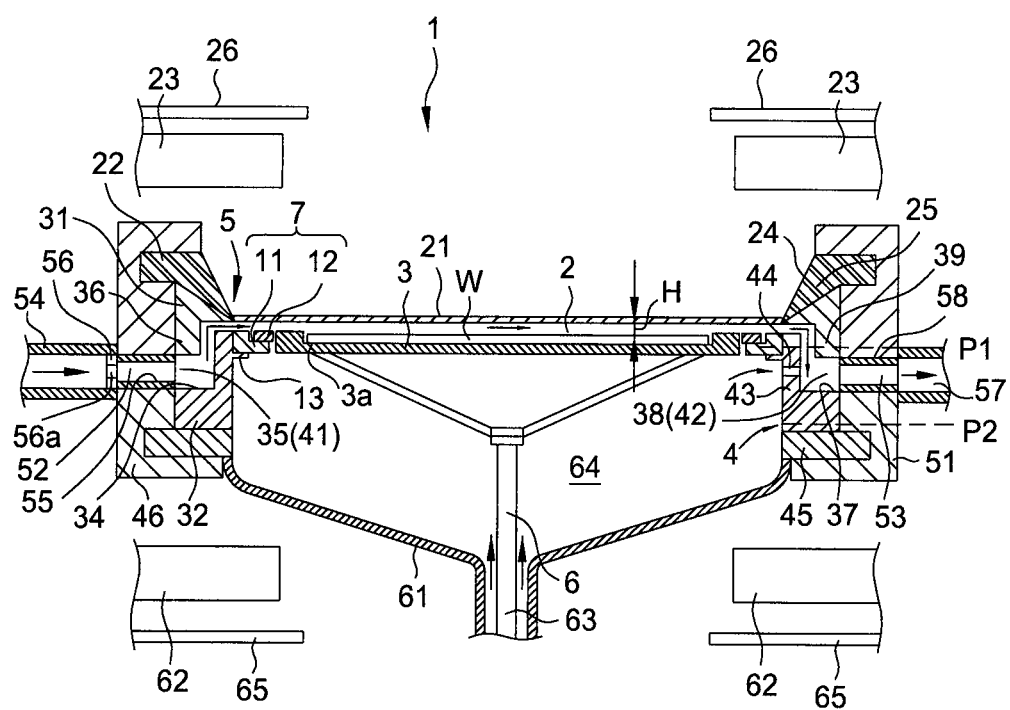
FIG. 1 is a cross-sectional view illustrating the entire configuration of an epitaxial growth apparatus according to an embodiment of the present invention.
Figure 2:
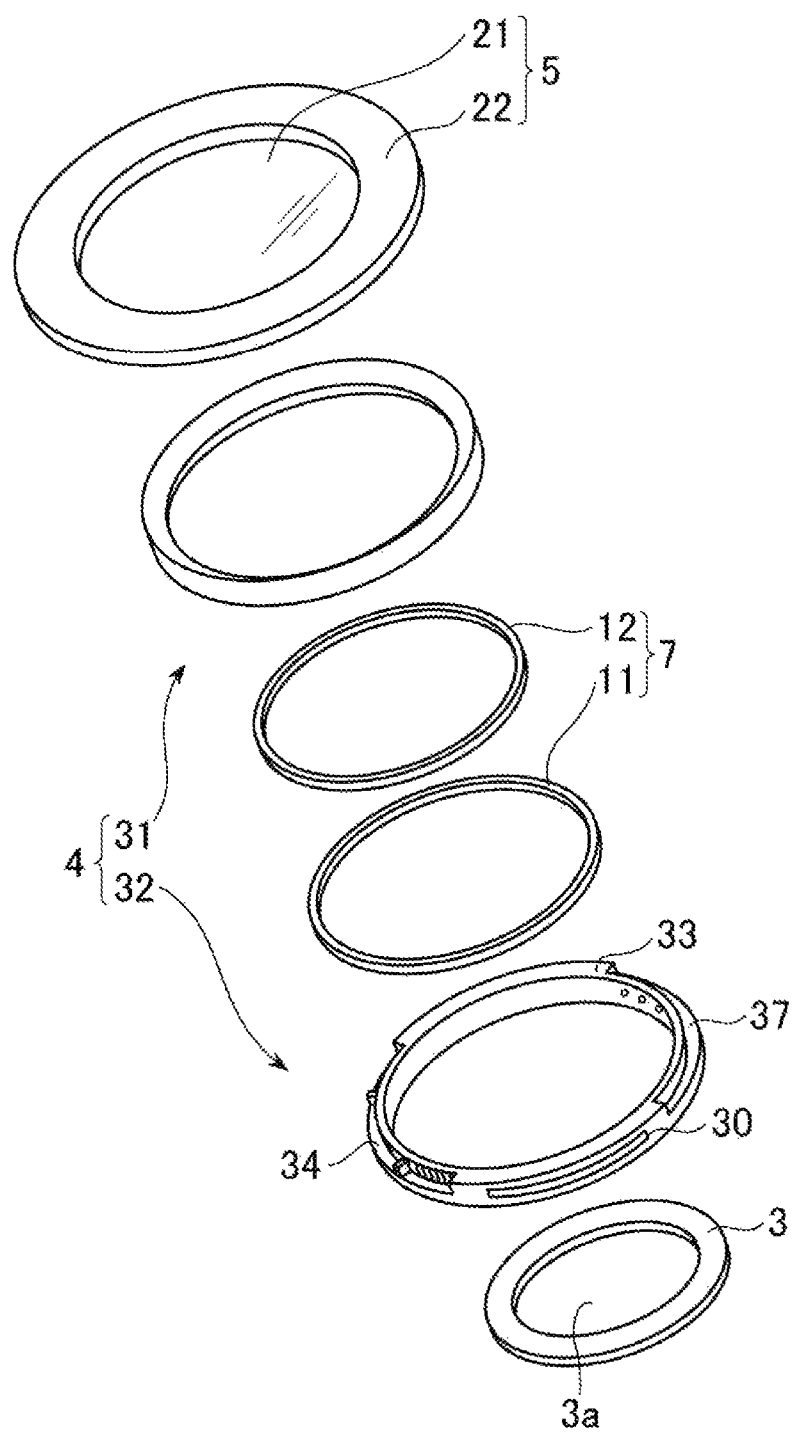
FIG. 2 is an exploded perspective view illustrating the configuration of a reaction chamber according to the embodiment of the present invention.
Figure 3:
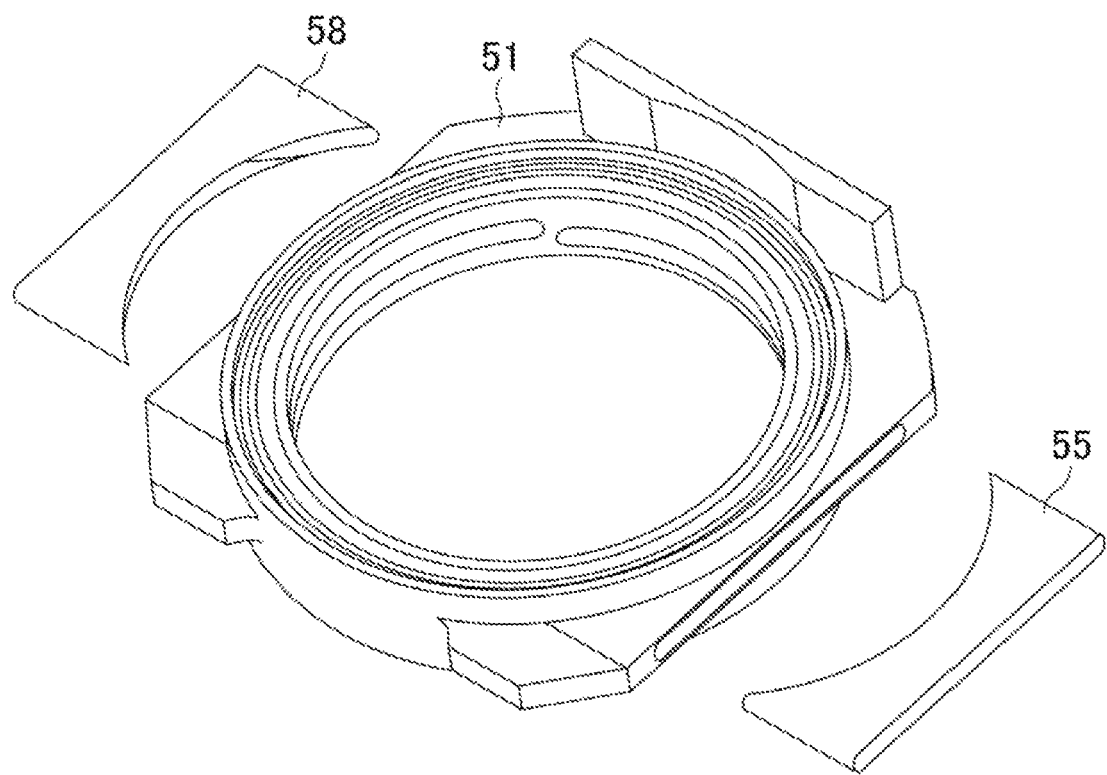
FIG. 3 is an exploded perspective view illustrating the outer configuration of the reaction chamber according to the embodiment of the present invention.

First, the configuration of an epitaxial growth apparatus 1 according to the embodiment of the present invention will be schematically described. FIG. 1 is a cross-sectional view illustrating the entire configuration of the epitaxial growth apparatus 1. FIG. 2 is an exploded perspective view illustrating the configuration of a reaction chamber 2 of the epitaxial growth apparatus 1. FIG. 3 is an exploded perspective view illustrating the outer configuration of the reaction chamber 2 of the epitaxial growth apparatus 1.

The epitaxial growth apparatus 1 is a film forming apparatus that enables, for example, a film of silicon to epitaxially grow on a substrate W.

The epitaxial growth apparatus 1 includes a reaction chamber 2. The reaction chamber 2 includes a susceptor 3 on which the substrate W. is mounted, a side wall 4, and a ceiling 5.

The susceptor 3 is a plate-like member having a circular shape when seen from the upper side and has a size slightly larger than the substrate W. The susceptor 3 is provided with a substrate concave portion 3a on which the substrate W is mounted. The susceptor 3 is supported by a susceptor support 6 having plural arms.

The susceptor support 6 lifts up and down the susceptor 3 while supporting the susceptor 3. The lifting range of the surface of the susceptor 3 on which the substrate W is mounted ranges from a film-forming position P1 at which a film is formed on the substrate W on the susceptor 3 to a substrate-carrying position P2 at which the substrate W is put in and out of the epitaxial growth apparatus 1. The susceptor support 6 is configured to enable the susceptor 3 and the substrate W to rotate by rotating about the axis of the susceptor support 6 at the film-forming position P1.

An annular susceptor ring 7 is disposed around the susceptor 3 at the film-forming position P1. Although details will be described later, the susceptor ring 7 includes a first ring 11 and a second ring 12 placed on the first ring 11. The susceptor ring 7 is supported by a flange portion 13 disposed in the side wall 4 of the reaction chamber 2.

The ceiling portion 5 includes a ceiling plate 21 and a support 22 supporting the ceiling plate 21. The ceiling plate 21 has permeability and is configured to heat the inside of the reaction chamber 2 by transmitting heat from heating means 23 (for example, a halogen lamp) disposed above the outside of the ceiling plate 21 and an upper reflector 26. That is, the epitaxial growth apparatus 1 according to this embodiment is a cold wall type epitaxial growth apparatus. In this embodiment, the ceiling plate 21 is formed of quartz.

Figure 4:
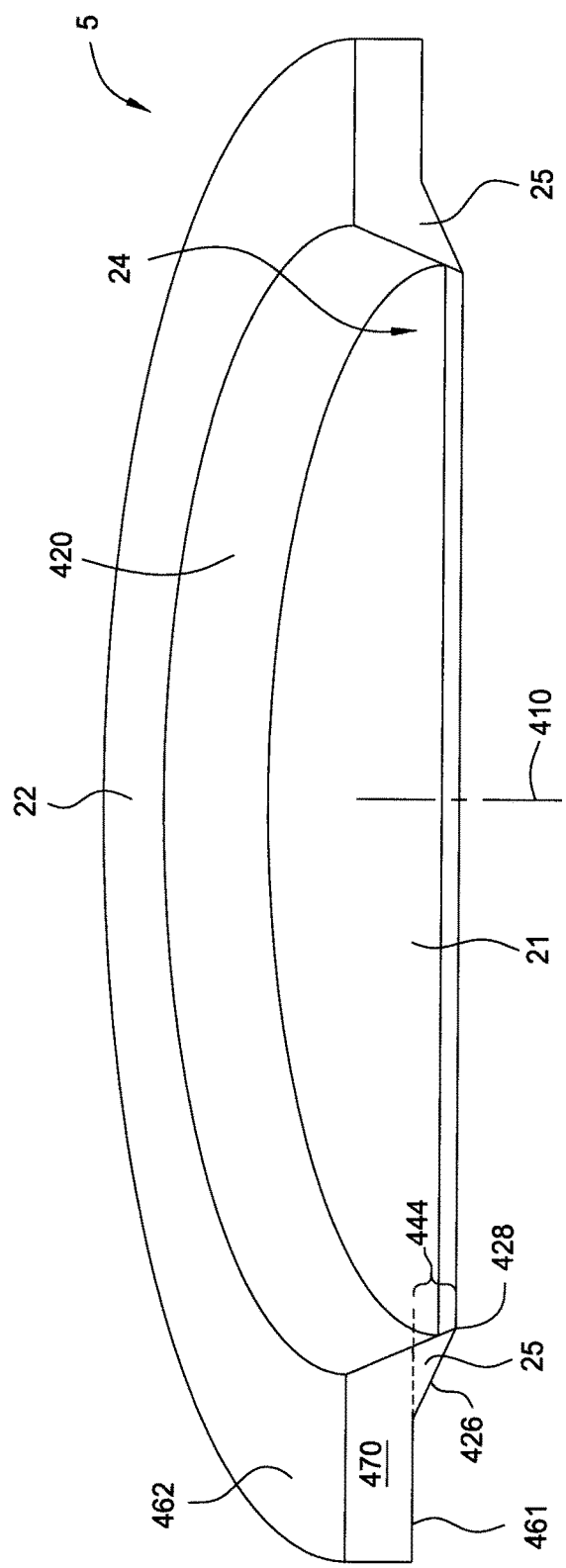
FIG. 4 is a perspective cross-sectional view illustrating the configuration of a ceiling portion according to the embodiment of the present invention.
Figure 5:
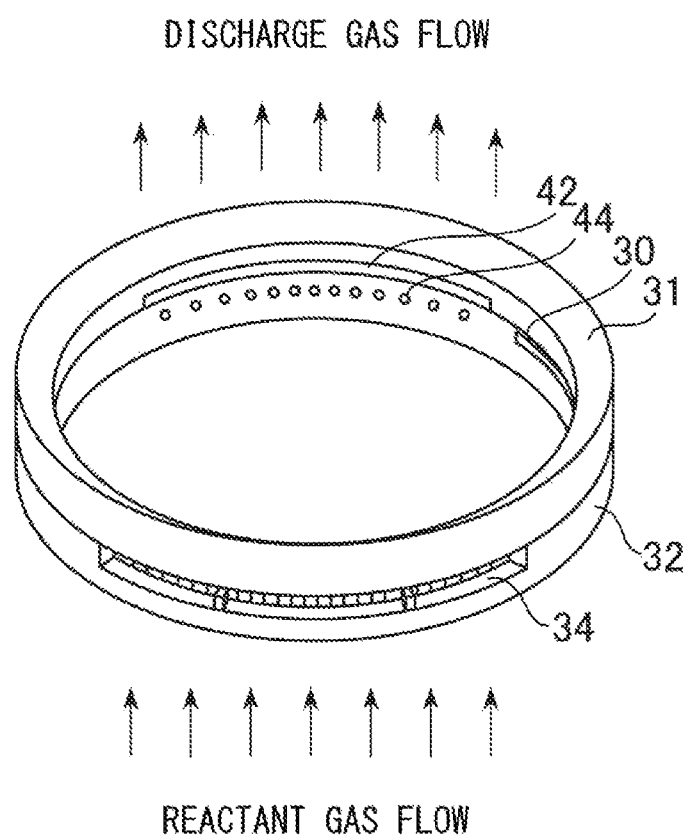
FIG. 5 is a diagram schematically illustrating the inner configuration of a side wall according to the embodiment of the present invention.
Figure 6:
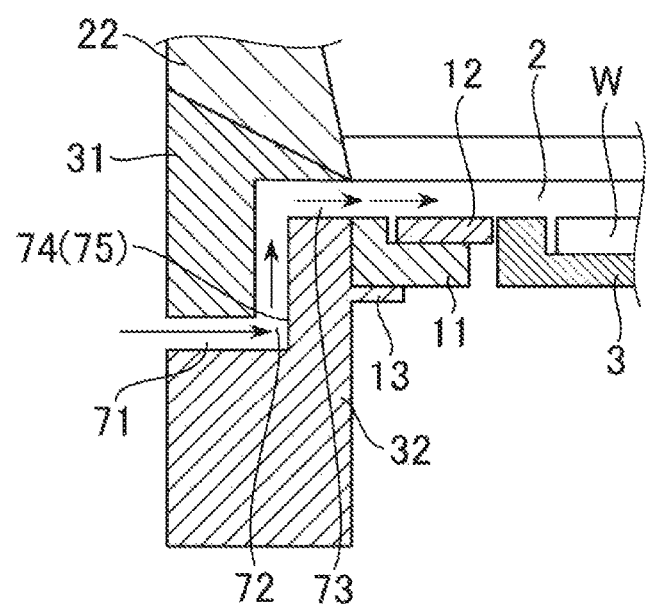
FIG. 6 is a cross-sectional view illustrating a reactant gas supply path according to the embodiment of the present invention.

Additionally referring to FIG. 4, the support 22 supporting the ceiling plate 21 has an annular shape, i.e., ring shape. The ring shaped support 22 has a body 470. The body 470 has a top surface 462 and a bottom surface 461. A protrusion 25 extends from the bottom surface 461 of the body 470. The ring shaped support 22 has an inner surface 420 extending across the body 470 and the protrusion 25. The inner surface 420 is disposed about a center 410 of the ring shaped support 22 to form an opening 24. The ring shaped support 22 has a first sloped portion 444, a second sloped portion 426, and a third sloped portion 442. The third sloped portion 442 and the first sloped portion 444 may be linearly aligned to form the inner surface 420. The third sloped portion 442 is disposed on the body 270 and extends from the top surface 462 to the bottom surface 461. The first sloped portion 444 is disposed on the protrusion 25 and extends from the first portion 442 to an inner edge 428 of the protrusion. The second sloped portion 426 is disposed on the protrusion 25 and extends from the bottom surface 461 to the first sloped portion 424. The ceiling plate 21 is disposed on the inner surface 420 and fixed to the inner edge 428 of the protrusion 25, which is close to the substrate W, extending into the of an opening 24 of the support 22. An example of the fixing method is a welding method.

The side wall 4 includes an annular upper side wall 31 and an annular lower side wall 32. The flange portion 13 is disposed on the inner circumference of the lower side wall 32. A substrate carrying port 30 is disposed below the flange portion 13. The upper side wall 31 has a slope portion corresponding to a slope portion outside of a protrusion 25 of the support 22 on the top surface thereof. The support 22 is disposed on the slope of the upper side wall 31.

In the top surface of the lower side wall 32, a part of the outer circumference thereof is cut out an a region in which the cutout is not formed serves as a mounting surface 33 on which the upper side wall 31 is mounted. A first concave portion 34 is formed in the lower side wall 32 by the cutout of the lower side wall 32. That is, the first concave portion 34 is a concave portion formed in a part, in which the mounting surface 33 is not formed, of the top surface of the lower side wall 32. In the upper side wall 31, a first convex portion 36 is formed at the position corresponding to the first concave portion 34 at the time of mounting the upper side wall on the lower side wall 32 so as to correspond to the shape of the first concave portion 34 and to form a gap 35 between the first concave portion 34 and the first convex portion. The gap 35 between the first convex portion 36 and the first concave portion 34 serves as a reactant gas supply path 41 (supply path). Details of the reactant gas supply path 41 will be described later.

In the region opposed to the first concave portion 34 of the lower side wall 32, a part of the outer circumferential portion of the top surface of the lower side wall 32 is cut out to form a second concave portion 37. In the upper side wall 31, a second convex portion 39 is formed at the position corresponding to the second concave portion 37 at the time of mounting the upper side wall on the lower side wall 32 so as to correspond to the shape of the second concave portion 37 and to form a gap 38 between the second concave portion 37 and the second convex portion. A gas discharge path 42 is formed by the second concave portion 37 and the second convex portion 39 of the upper side wall 31.

In this way, the reactant gas supply path 41 and the gas discharge path 42 face each other in the reaction chamber 2 and the reactant gas in the reaction chamber 2 flows over the substrate W in the horizontal direction.

A purge hole 44 through which a purge gas is discharged is formed in a wall surface 43 constituting the second concave portion 37 of the lower side wall 32. The purge hole 44 is formed below the flange portion 13. In that the purge hole 44 is formed in the wall surface 43 constituting the second concave portion 37, the purge hole 44 communicates with the gas discharge path 42. Therefore, both the reactant gas and the purge gas are discharged through the gas discharge path 42.

An annular platform 45 is disposed on the bottom surface side of the lower side wall 32 of the side wall 4 and the side wall 4 is placed on the platform 45.

An annular clamping portion 51 is disposed on the outer circumference sides of the ceiling portion 5, the side wall 4, and the platform 45, and the annular clamping portion 51 clamps and supports the ceiling portion 5, the side wall 4, and the platform 45. The clamping portion 51 is provided with a supply-side communication path 52 communicating with the reactant gas supply path 41 and a discharge-side communication path 53 communicating with the gas discharge path 42. A gas introduction tube 55 is inserted into the supply-side communication path 52. A gas discharge tube 58 is inserted into the discharge-side communication path 53.

A reactant gas introducing portion 54 is disposed outside the clamping portion 51, and the reactant gas introducing portion 54 and the supply-side communication path 52 communicate with each other. In this embodiment, a first source gas and a second source gas are introduced from the reactant gas introducing portion 54. The second source gas also serves as a carrier gas. A mixture of three or more types of gases may be used as the reactant gas. A rectifying plate 56 is disposed in the joint of the supply-side communication path 52 and the reactant gas introducing portion 54 so as to be perpendicular to the gas flow channel. The rectifying plate 56 is provided with plural holes 56a in a line along the circumferential direction, and the first source gas and the second source gas are mixed and rectified by causing the reactant gas to pass through the holes 56a. A gas discharge portion 57 is disposed outside the clamping portion 51. The gas discharge portion 57 is disposed at a position facing the reactant gas introducing portion 54 with the center of the reaction chamber 2 interposed therebetween.

An apparatus bottom portion 61 is disposed in the lower part of the inner circumference side of the platform 45. Another heating means 62 and a lower reflector 65 are disposed outside the apparatus bottom portion 61 and the substrate W can be heated from the lower side.

The center of the apparatus bottom portion 61 is provided with a purge gas introducing portion (not shown) through which the axis portion 63 of the susceptor support 6 is inserted and the purge gas is introduced. The purge gas in introduced into a lower reaction chamber part 64 formed by the apparatus bottom portion 61, the lower side wall 32, and the platform 45 from purge gas introducing means not shown and disposed in the purge gas introducing portion. The purge hole 44 communicates with the lower reaction chamber part 64.

Summary of Film Forming Method Using Epitaxial Growth

A film forming method using the epitaxial growth apparatus according to this embodiment will be described below.

First, the susceptor 3 is moved to the substrate-carrying position P2, a substrate W is put in from the substrate carrying port 30, and the susceptor 3 is moved to the film-forming position P1. For example, a silicon substrate with a diameter of 200 mm is used as the substrate W. Then, the substrate is heated from the standby temperature (for example, 800° C.) to the growth temperature (for example, 1100° C.) by the use of the heating means 23 and 62. The purge gas (for example, hydrogen) is introduced into the lower reaction chamber portion 64 from the purge gas introducing portion. The reactant gas (for example, trichlorosilane as the first source gas and hydrogen as the second source gas) is introduced into the reaction chamber 2 through the reactant gas supply path 41 from the reactant gas introducing portion 54. The reactant gas forms a boundary layer on the surface of the substrate W and a reaction occurs in the boundary layer. Accordingly, a silicon film is formed on the substrate W. The reactant gas is discharged from the gas discharge path 42 communicating with the reaction chamber 2. The purge gas is discharged to the gas discharge path 42 through the purge hole 44. After the epitaxial growth ends in this way, the temperature falls to the standby temperature and the substrate W is taken out and is moved to another chamber of a semiconductor manufacturing apparatus.

Details of Film Forming Method Using Epitaxial Growth Apparatus

Details of the constituent members of the epitaxial growth apparatus 1 according to this embodiment and details of the film forming method according to this embodiment will be described below.

Figure 20:
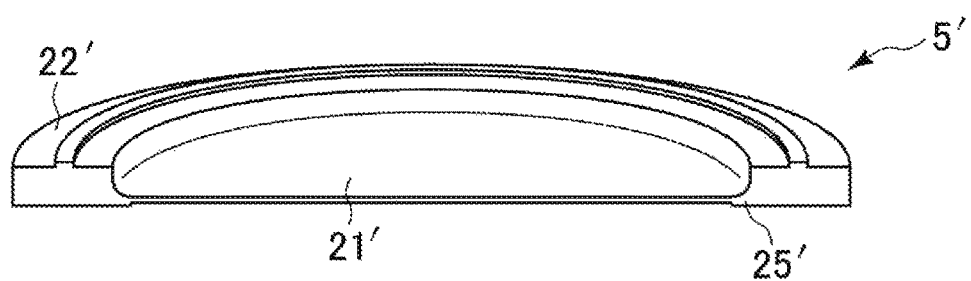
FIG. 20 is a perspective cross-sectional view illustrating the configuration of a ceiling portion of an epitaxial growth apparatus according to the related art.

FIG. 4 is a perspective cross-sectional view illustrating the configuration of the ceiling portion 5 in this embodiment. As shown in the drawing, the inner surface 420 of the support 22, supporting the ceiling plate 21 at the inner edge 428, has a diameter slowing decreasing toward the substrate. When the support 22 is viewed from the rear side (bottom side), the inner circumferential portion protrudes to form the protrusion 25. The protrusion 25 extends downward and inward from the bottom surface 461. The protrusion 25 is formed to have a diameter slowly decreasing in the protruding direction. In this way, the protrusion 25 of the support 22 includes two slope portions, the second slope portion 426 and the first slope portion 444. An angle between the second slope portion 426 and the first slope portion 444 may be less than 90 degrees. The first sloped portion 444, forming a portion of the inner surface 420, decreases the diameter of the inner surface 420 in a protruding direction towards the inner edge 428. Thus, the diameter of the opening 24 of the support 22 decreases in size to support the outer side of the circumferential edge at the circumferential edge of the ceiling plate 21. On the other hand, FIG. 20 is a perspective cross-sectional view illustrating an example of a ceiling portion 5' of an epitaxial growth apparatus according to the related art. As shown in the drawing, in the ceiling portion 5' of the apparatus according to the related art, a support 22' supports a ceiling plate 21' in the same plane as the ceiling plate 21' at the circumferential edge of the ceiling plate 21', and the support 22' has a shape having a substantially rectangular corner 25'.

In this way, in this embodiment, since the support 22 is formed in such a shape on which a stress is less concentrated than that in the related art, the distance H between the substrate W and the ceiling plate 21 can be reduced, that is, less than 10 mm.

Specifically, most infrared rays from the heating means 23 passes through the ceiling plate 21 (21'), but the ceiling plate 21 (21') absorbs radiant heat from the susceptor 3 or the substrate W. The absorbed heat is input to the support 22 (22') through the joint with the support 22 (22') from the ceiling plate 21 (21'). Here, when the distance H between the substrate W and the ceiling plate 21 (21') is reduced, the amount of radiant heat absorbed increases and the amount of heat input to the support 22 (22') increases. Therefore, when the support 22' has a substantially rectangular corner 25' as in the ceiling portion 5' in the related art, a stress may be concentrated on the corner 25' to generate cracks or the like.

On the other hand, in this embodiment, by forming the protrusion 25 in the support 22 and supporting the ceiling plate 21 from the upper side and the outer side of the circumferential edge at the circumferential edge of the ceiling plate 21, the ceiling plate 21 can be supported to the substrate side without forming the corner (25') on which a stress is easily concentrated as small as possible.

In this embodiment, since the distance between the ceiling place 21 and the substrate W is rescued to narrow the boundary layer as described above, the reactant gas is likely to escape to the outside of the substrate W and the film thickness distribution of the substrate may not be uniformized well, which should be preferably prevented. Accordingly, in this embodiment, a guide portion is disposed in the reactant gas supply path 41 to uniformize the gas flow, as described below.

The guide portion disposed in the reactant gas supply path 41 will be described below in detail with reference to FIGS. 5 to 7B. As described above, the reactant gas supply path 41 is formed by the first concave portion 34 of the lower side wall 32 and the first convex portion 36 of the upper side wall 31 and communicates with the reactant gas introducing portion 54 through the gas introducing tube 55 in the supply-side communication path 52. The reactant gas supply path 41 includes a first supply path 71 extending in the direction (horizontal direction) corresponding to the gas introduction direction from the reactant gas introducing portion 54, a second supply path 72 communicating with the first supply path 71 and extending the direction (vertical direction) perpendicular to the gas introduction direction, and a third supply path 73 communicating with the second supply path 72 and extending in the direction (horizontal direction) parallel to the gas introduction direction. The third supply path 73 communicates with the reaction chamber 2. That is, the reactant gas supply path 41 is formed in a step shape ascending from the supply-side communication path 52 which is the entrance of the reactant gas to the exit which is the exit of the reactant gas and is connected to the reaction chamber 2.

Here, since the second supply path 72 extends in the vertical direction as described above, the gas introduced from the reactant gas introducing portion comes in contact with a wall surface 74 of the second supply path 72 facing the reactant gas introducing portion 54. Accordingly, the reactant gas is diffused and the mixing property of the reactant gas is improved. That is, the second supply path 72 serves as a mixing chamber of the reactant gas. In this case, a groove 75 extending in the vertical direction is formed in the wall surface 74 of the second supply path 72 in this embodiment so as for the reactant gas no to stay in the second supply path 72, and the groove 75 serves as a guide portion. Since the groove 75 is formed in this way, the gas diffused by contact with the wall surface 74 of the second supply path 72 can easily flow into the third supply path 73, can be rectified along the groove 75 to improve the rectilinear flowing property of the reactant gas, thereby suppressing diffusion of the reactant gas when the reactant gas flows in the reaction chamber 2.

Figure 7A:
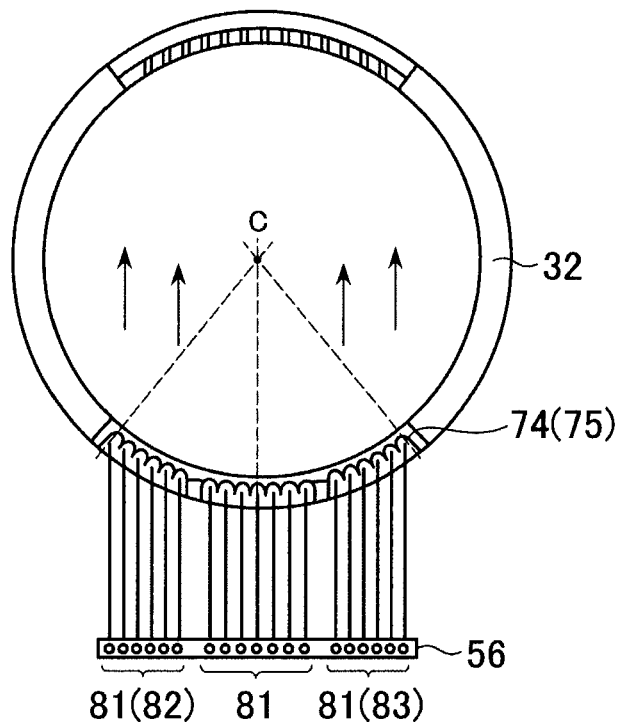
FIGS. 7A and 7B are diagrams schematically illustrating the reactant gas supply path according to the embodiment of the present invention.
Figure 7B:
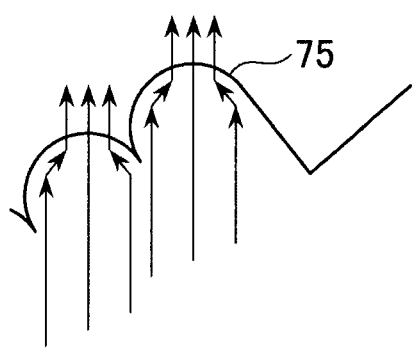

The groove 75 will be described below in detail. Plural grooves 75 are continuously formed as a concave portion in the entire surface of the wall surface 74 of the second supply path 72. As shown in FIG. 7B, the grooves 75 as the concave portion are curved in the width direction of the groves in this embodiment, each groove 75 as an arc shape when viewed from the top side. Since the groove 75 is curved in the width direction, the reactant gas is not likely to be diffused (is likely to be concentrated) when the reactant gas comes in contact with the bottom of the grooves 75 of the wall surface 74, and is not likely to be diffused to the outside of the substrate W when the reactant gas flows in the reaction chamber 2. When the depth of the grooves 75 is excessively large, the diffusion can be suppressed but the first source gas and the second source gas in the reactant gas is not likely to be mixed. In an embodiment of the present invention, that the depth of the grooves 75 is preferably set to a range of 1 mm to 5 mm and more preferably 3 mm.

The grooves 75 are formed toward the center c in the in-plane direction of the lower sidewall 32. That is, the grooves 75 are arranged along the circumferential direction of the lower side wall 32. By arranging the grooves in this way, the rectification property can be enhanced so that the horizontal component in the flow direction of the reactant gas guide by the grooves 75 and introduced into the reaction chamber 2 corresponds to the horizontal component in the direction extending from the center of the opening of the reactant gas supply path 41 facing the reactant chamber 2 to the center of the reaction chamber 2, thereby suppressing diffusion of the reactant gas in the reaction chamber 2.

The grooves 75 are formed at positions at which the center in the width direction of each groove 75 substantially agrees (corresponds) to the center of each hole 56a of the rectifying plate 56 disposed in the reactant gas introducing portion 54. That is, in this embodiment, the number of grooves 75 in the wall surface 74 is equal to the number of holes 56a. Accordingly, since the reactant gas rectified by the rectifying plate 56 flows in the grooves 75, the rectification performance is further enhanced to improve the rectilinear flowing property of the reactant gas.

In this embodiment, the grooves 75 are formed in the entire surface of the wall surface 74 of the second supply path 72, but may be formed at least in an end portion of the wall surface 74 of the second supply path 72. The end portion means a portion corresponding to the extreme end region of plural regions into which the holes of the rectifying plate 56 are divided. For example, in the example shown in FIGS. 7A and 7B, the rectifying plate 56 are divided into three regions 81 and the grooves 75 have only to be formed to correspond to the holes of the extreme end regions 82 and 83. Since the reactant gas is likely to escape to the outside of the substrate W as described above, it is particularly preferable that the grooves 75 are formed to enhance the rectilinear flowing property of the reactant gas in the end portions of the reactant gas supply path 41. In this case, by forming the grooves 75 serving as a guide in the form of a concave portion, it is possible to easily obtain such an effect. For example, when a rectifying member is separately disposed in the second supply path 72, a problem may occur in the mixing property of the reactant gas or the manufacturing cost. However, such as problem is solved by forming the grooves 75 as a concave portion as in this embodiment.

Figure 8A:
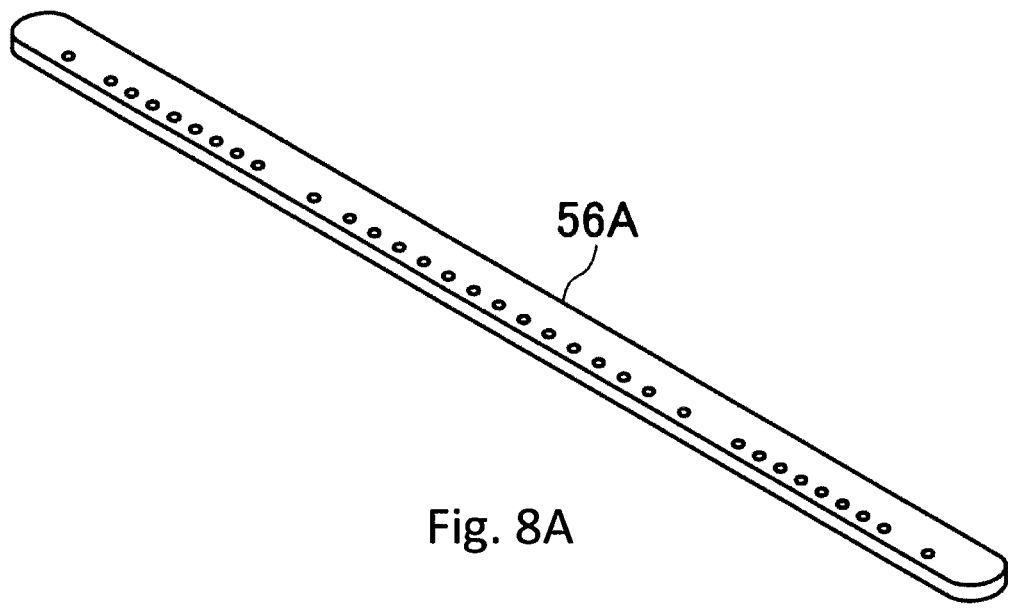
FIGS. 8A and 8B are perspective views illustrating an example of a rectification plate according to the embodiment of the present invention.
Figure 8B:
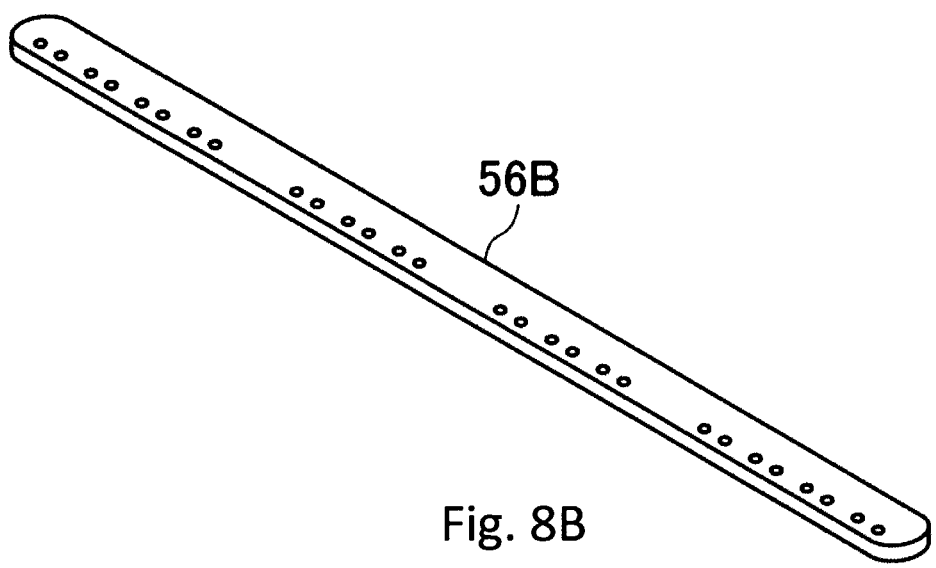

FIGS. 8A has 8B are perspective views illustrating an example of the rectifying plate 56. As shown in the drawings, the rectifying plate 56 has only to be ready to follow the pattern of the grooves 75. The opening ratio of the rectifying plate 56 is preferably determined to be an optimal value in consideration of incidental equipment such as a scrubber or the shape, the length, and the like of an external pipe, as well as the viewpoint of growth rate.

In this embodiment, since the distance between the ceiling plate 21 and the substrate W is reduced to narrow the boundary layer as described above, the reactant gas may easily flow into the lower part of the reaction chamber 2 and the temperature distribution of the substrate W may not be likely to be uniformized. As a result, the degradation in the film thickness distribution or the film quality at the time of forming a thick film (for example, distribution of resistivity or occurrence of crystal defects) may be caused. In this embodiment, in order to prevent these problems, the susceptor ring 7 is formed by two members. This point will be described below.

Figure 9:
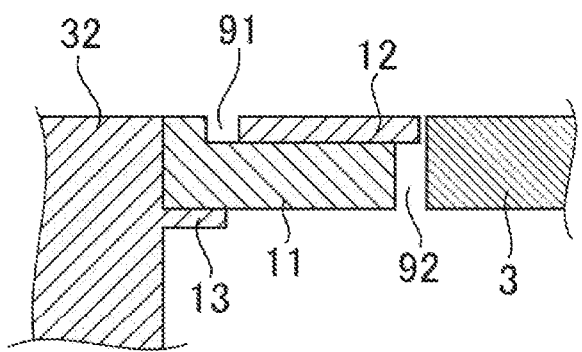
FIG. 9 is a partial cross-sectional view illustrating an example of a susceptor ring according to the embodiment of the present invention.

As enlarged in FIG. 9, the first ring 11 of the susceptor ring 7 is disposed spaced apart from the outer circumference of the susceptor and a stepped portion 91 having a low top surface is formed in the inner circumference of the first ring. The second ring 12 is placed on the stepped portion 91 and the second ring 12 is formed to face a clearance portion 92 formed between the first ring 11 and the susceptor 3, that is, to protrude to the clearance portion 92. The second ring 12 is disposed so that the top surface thereof is flush with the top surface of the susceptor 3. By making the top surface of the second ring 12 flush with the top surface of the susceptor 3 in this way, the reactant gas which is maintained in a state mixed and rectified in the reactance gas supply path 41 or the like can be smoothly supplied to the substrate W without lowering the flow rate as much as possible. The top surface of the susceptor 3 mentioned herein means a top surface of the susceptor 3 in a region in which the substrate concave portion 3a (see FIGS. 1, 2, 11, and 12) is not formed. The second ring 12 in this embodiment is formed of silicon carbide in consideration of thermal conductivity.

By forming the second ring 12 and the first ring 11 out of different members in this way, the susceptor ring 7 can be constructed with more accuracy. That is, the distance between the susceptor ring 7 and the susceptor 3 can be reduced to the limit and it is thus possible to reduce flowing of the reactant gas to the rear side of the substrate W, that is, to the bottom side 64 of the reaction chamber and to uniformize the temperature distribution of the substrate W. As a result, according to this embodiment, the film thickness distribution of the film quality distribution of the formed film is uniformized.

By providing two members of the first ring 11 and the second ring 12, the conduction of heat between the first ring 11 and the second ring 12 can be suppressed more than the case where the first ring 11 and the second ring 12 are formed of a single member.

By causing the second ring 12 to face the clearance portion 92 in this way, it is possible to reduce leakage of the reactant gas from between the susceptor ring 7 and the susceptor 3 toward the lower side at the time of forming a film and thus the flow of the reactant gas is not likely to be disturbed. Since leakage of the reactant gas to the lower side can be reduced, it is possible to reduce particles.

In this case, the second ring 12 is thinner than the first ring 11. Accordingly, it is possible to suppress heat loss from the susceptor 3 by radiation. Since the second ring 12 is thinner, it is possible to reduce the amount of heat for maintaining (pre-heating) the second ring 12 at a predetermined high temperature. In another embodiment, when the first ring 11 is formed of a material having small thermal conductivity, the first ring 11 serves as a thermal insulator, thereby further enhancing the above-mentioned effect.

In this embodiment, the second ring 12 is configured to face the clearance portion 92, but the invention is not limited to this configuration. The susceptor ring 7 can be constructed with high precision as long as the second ring 12 is placed at least on the stepped portion 91 of the first ring 11. Accordingly, the distance between the susceptor ring 7 and the susceptor 3 can be reduced to the limit and it is thus possible to reduce flowing of the reactant gas to the rear side of the substrate W and to uniformize the temperature distribution of the substrate.

In this embodiment, since the distance between the ceiling plate 21 and the substrate W is reduced to narrow the boundary layer, the ceiling surface of the ceiling plate 21 can be easily coated with the reactant gas. When the ceiling surface is coated, the ceiling surface is bedimmed and thus a film may not be satisfactorily formed using a cold wall type epitaxial growth apparatus that is heated using heating means 23 via the ceiling plate 21. On the contrary, in this embodiment, by forming the grooves 75 in the wall surface of the reactant gas supply path 41 and forming the susceptor ring 7 out of two members as described above, the reactant gas is not likely to stay in the reaction chamber 2 and it is thus possible to suppress attachment of a coating material. As a result, it is possible to form a film continuously and satisfactorily.

Figure 10:
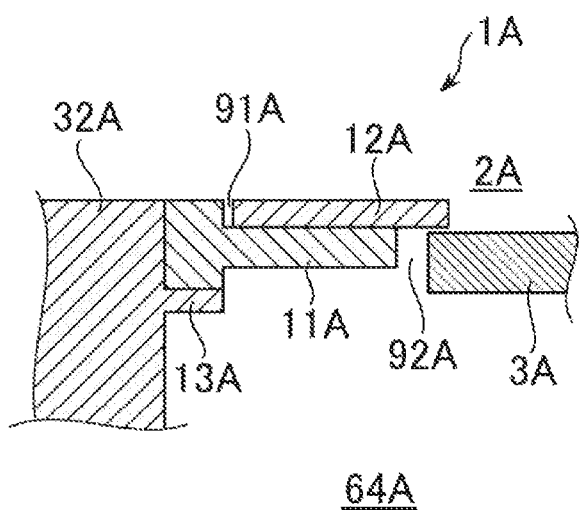
FIG. 10 is a partial cross-sectional view illustrating another example of the susceptor ring according to the embodiment of the present invention.

FIG. 10 shows a modification example of the susceptor ring 7. This modification example is different from the embodiment shown in FIG. 9, in that a second ring 12A is disposed to cover a clearance portion 92A. In this modification example, a first ring 11A is placed on a flange portion 13A of a side wall 32A. The second ring 12A is placed on a stepped portion 91A of the first ring 11A and the inner circumference faces the outer circumference of the susceptor 3A.

In this modification example, since the second ring 12A is disposed to cover the clearance portion 92A, it is possible to further suppress flowing of the reactant gas flowing into the reaction chamber 2A to the lower reaction chamber part 64A. Here, in order to prevent the second ring 12A from blocking heating of the susceptor 3A from the heating means 23 not shown in FIG. 10, it is preferable that the overlap area of the second ring 12A and the susceptor 3A be small.

In this modification example, the thickness of the second ring 12A is preferably set to, for example, a range of 0.5 mm to 2 mm and more preferable about 0.8 mm. By setting this thickness, it is possible to suppress heat loss due to radiation from the susceptor 3A to the second ring 12A as much as possible.

Figure 11:
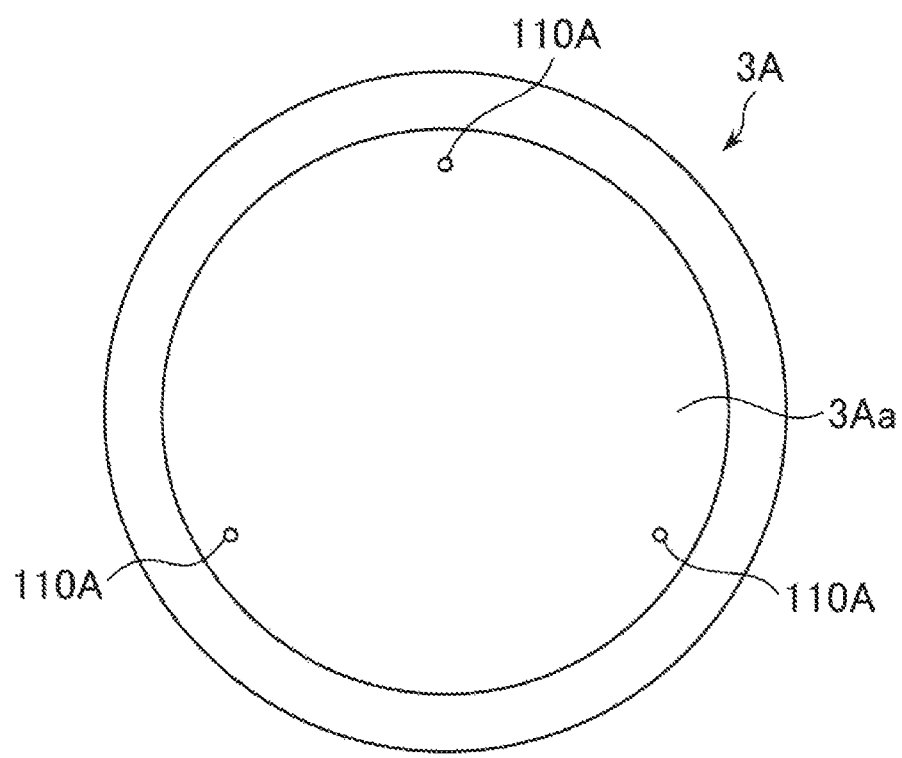
FIG. 11 is a plan view illustrating an example of a susceptor according to the embodiment of the present invention.
Figure 12:
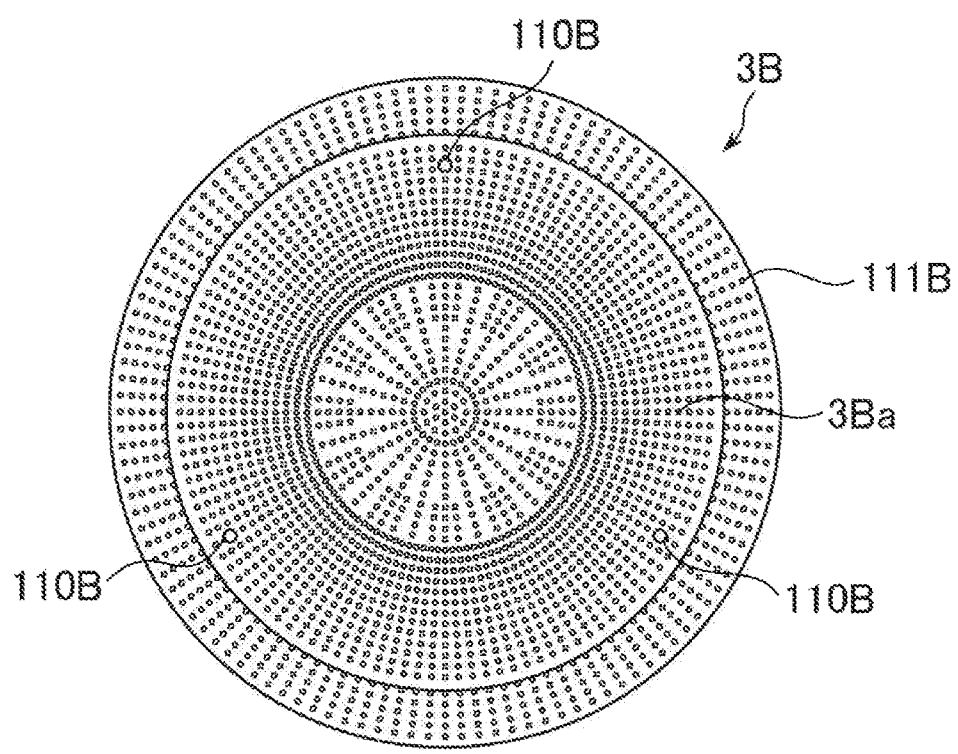
FIG. 12 is a plan view illustrating another example of the susceptor according to the embodiment of the present invention.

FIGS. 11 and 12 are plan views illustrating examples of the susceptor 3 according to an embodiment of the present invention. As shown in the drawings, susceptors 3A and 3B are provided with lift-pin through-holes 110A and 110B through which lift pins 123 (see FIG. 13) pass. As shown in FIG. 12, plural through-holes 111B may be formed. A problem that gas therebetween may be let out at the time of placing the substrate on the susceptor and the substrate W slides in the horizontal direction can be solved by the through-holes 111B. When this susceptor 3B is used, the uniformization in film thickness distribution or resistivity distribution of the substrate W is superior to the case where the susceptor 3A is used. This is more marked when the diameter of the through-holes 111B becomes smaller and the number of through-holes 111B becomes larger. It is preferable that the opening ratio be more than 4% and it is more preferable that the through-holes 111B be formed around the substrate concave portion 3Ba of the susceptor as well as in the substrate concave portion.

Figure 13:
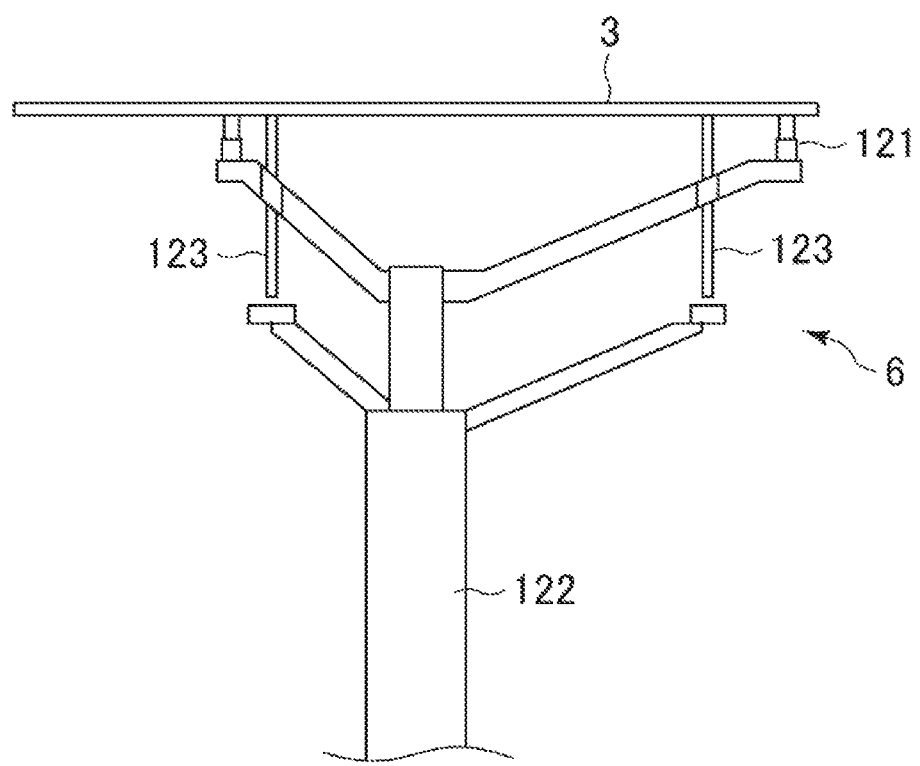
FIG. 13 is a diagram schematically illustrating the configuration of a susceptor support according to the embodiment of the present invention.
Figure 14:
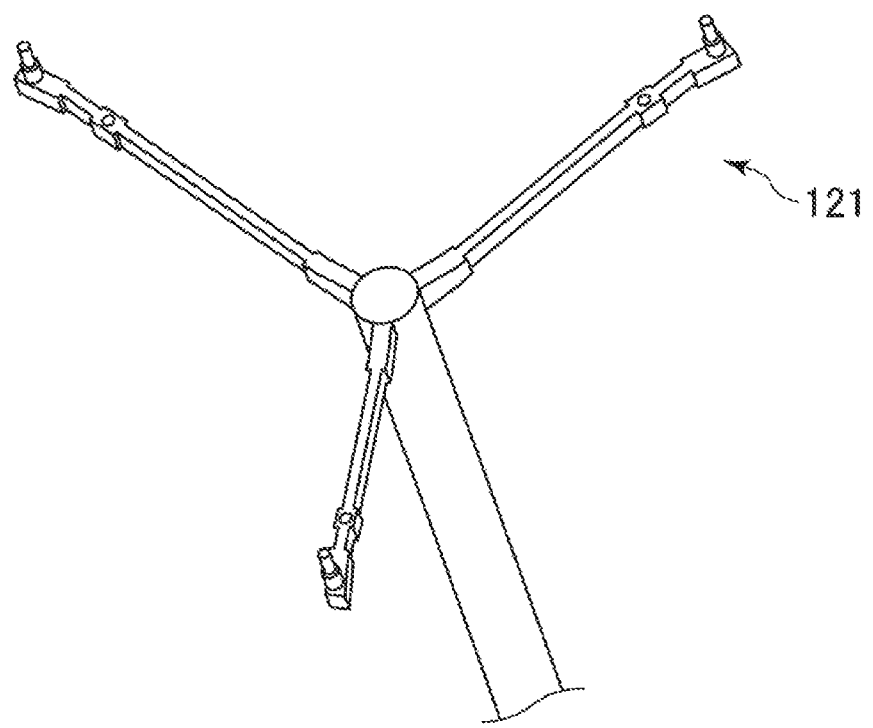
FIG. 14 is a perspective view illustrating a susceptor shaft according to the embodiment of the present invention.
Figure 15:
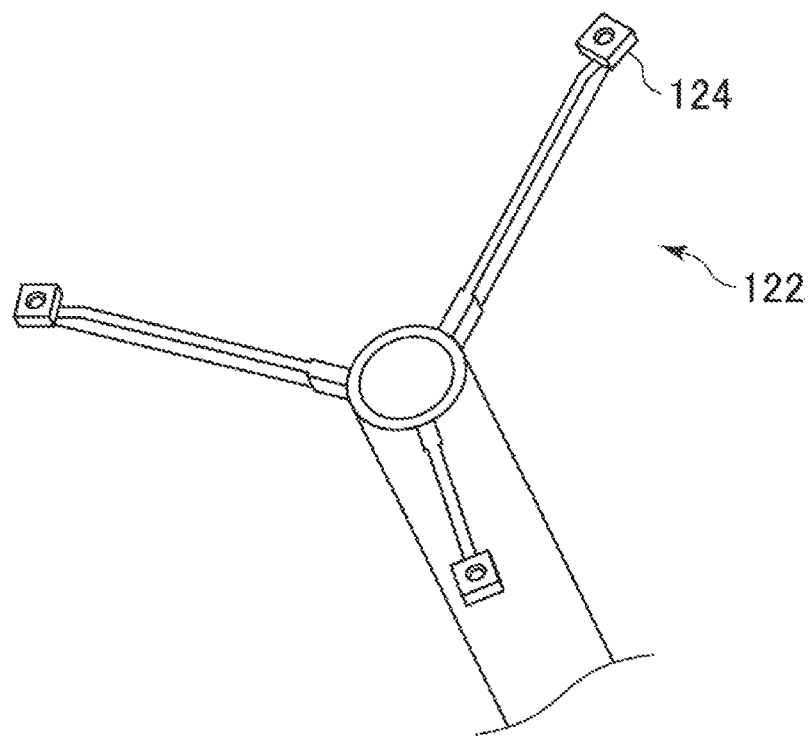
FIG. 15 is a perspective view illustrating an example of a substrate lift according to the embodiment of the present invention.

FIGS. 13 to 16 show examples of the susceptor support 6. As shown in FIG. 13, the susceptor support 6 includes a susceptor shaft 121, a substrate lift 122, and lift pins 123. The susceptor 3 is supported by three arms of the susceptor shaft 121. Three arms of the substrate life 122 are provided with pedestals 124 having a concave portion on which the lower end of the corresponding lift pin 123 is placed, respectively. The axis portion of the substrate lift 122 is formed in a cylindrical shape, and the axis portion of the susceptor shaft 121 can be inserted into the axis portion of the substrate lift 122.

In this embodiment, the arms in the susceptor support 6 have a thickness smaller than in the related art. Accordingly, since the influence of the susceptor support 6 can be reduced at the time of heating the substrate W on the susceptor 3 by the use of the heating means 62, it is possible to uniformize the temperature distribution of the susceptor 3. The detailed configuration and the lifting operation of the susceptor support 6 in the embodiment are the same as in the susceptor apparatus described in Pamphlet of International Publication WO2013/005481 filed by the applicant of the present invention. However, the susceptor apparatus described the Pamphlet of International Publication includes a single susceptor shaft (platform shaft), but the susceptor support 6 in this embodiment includes three susceptor shafts (arms) 121.

Figure 16:
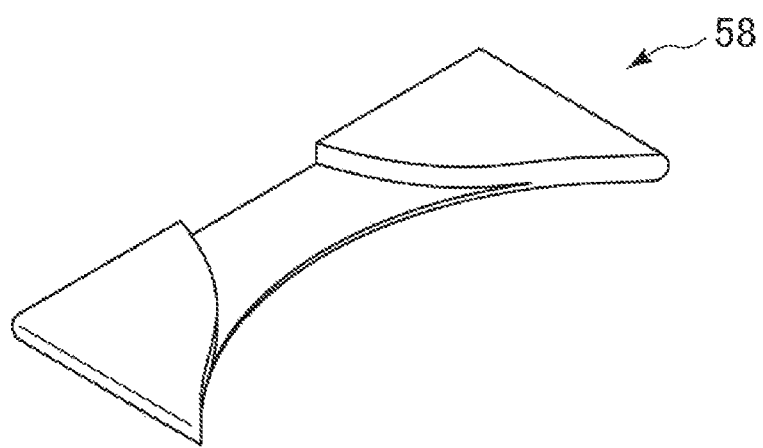
FIG. 16 is a perspective cross-sectional view illustrating an example of a gas discharge tube according to the embodiment of the present invention.

FIG. 16 is a perspective cross-sectional view illustrating an example of the gas discharge tube 58 in this embodiment. As shown in the drawing, the gas discharge tube 58 is formed so that the opening is narrowed toward the center from the reaction chamber 2 to the gas discharge portion 57. Accordingly, exhaust is rectified at the center, thereby improving the exhaust efficiency.

Figure 21:
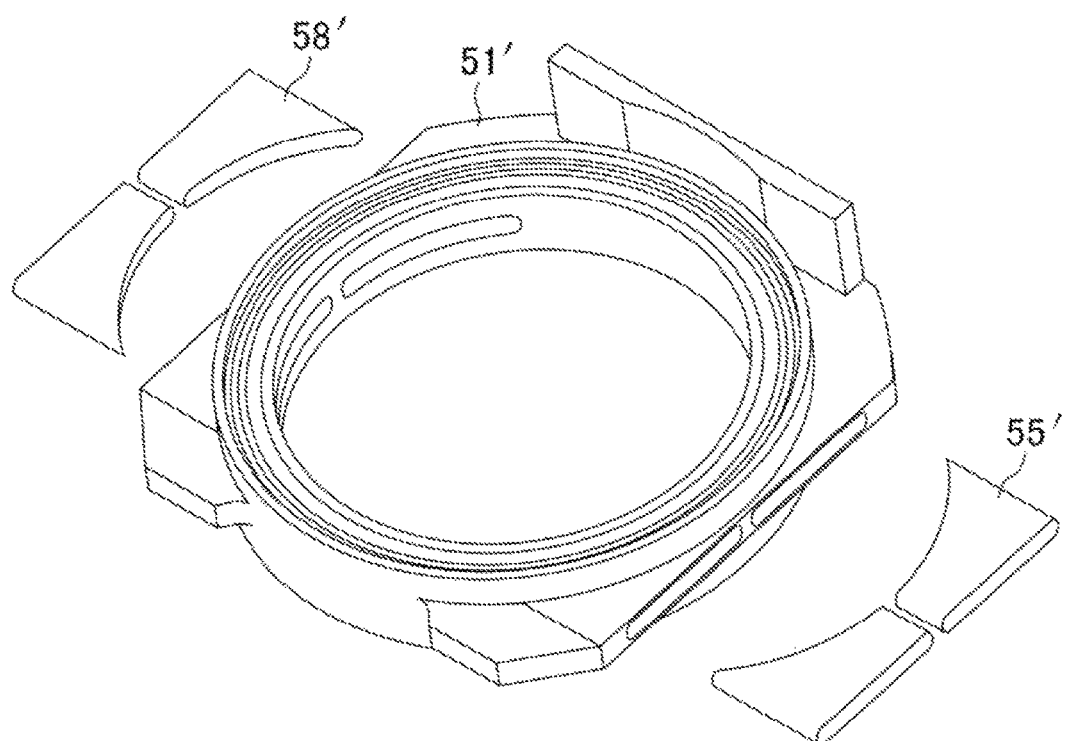
FIG. 21 is an exploded perspective view illustrating the outer configuration of a reaction chamber of the epitaxial growth apparatus according to the related art.

FIG. 21 is an exploded perspective view illustrating the outer configuration of the reaction chamber 2 in the epitaxial growth apparatus according to the related art. As shown in the drawing, comparing the gas introduction tube 55 and the gas discharge tube 58 with the gas introduction tube 55' and the gas discharge tube 58', finished portions at the central portions thereof are removed in this embodiment. Accordingly, the flow of gas affecting the film thickness distribution is smoothed.

The reactant gas flows into the lower reaction chamber part 64 when the opening ratio of the gas discharge path 42 and the purge hole 44 is excessively large, and the purge gas affects the film forming process in the reaction chamber 2 when the opening ratio is excessively small. Accordingly, the openings thereof are formed so that the opening ratios have the optimal values.

Figure 17:
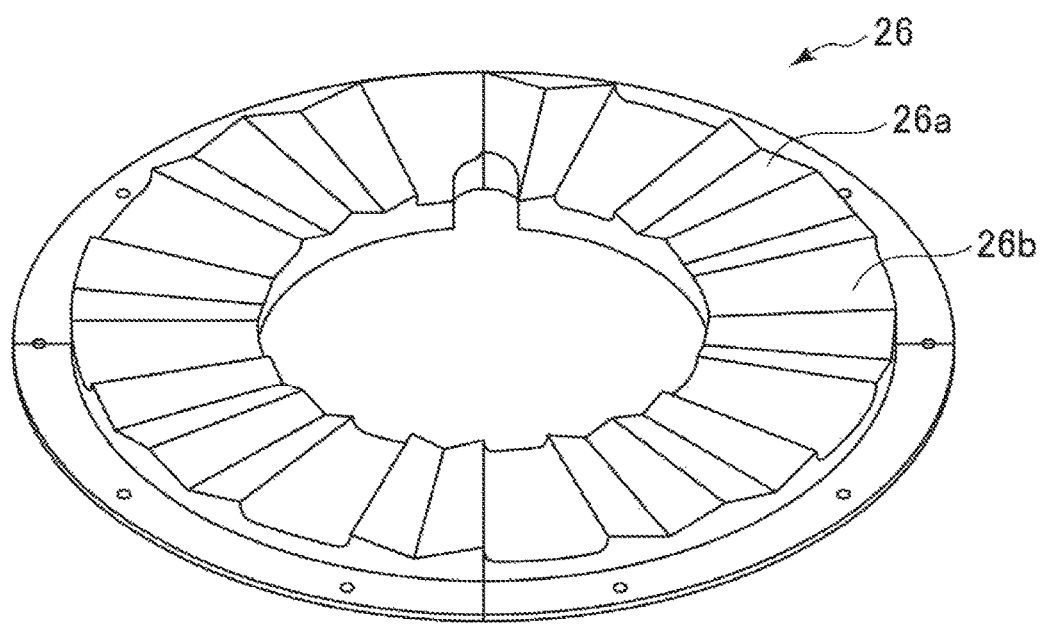
FIG. 17 is a perspective view illustrating an example of an upper reflector according to the embodiment of the present invention.
Figure 22:
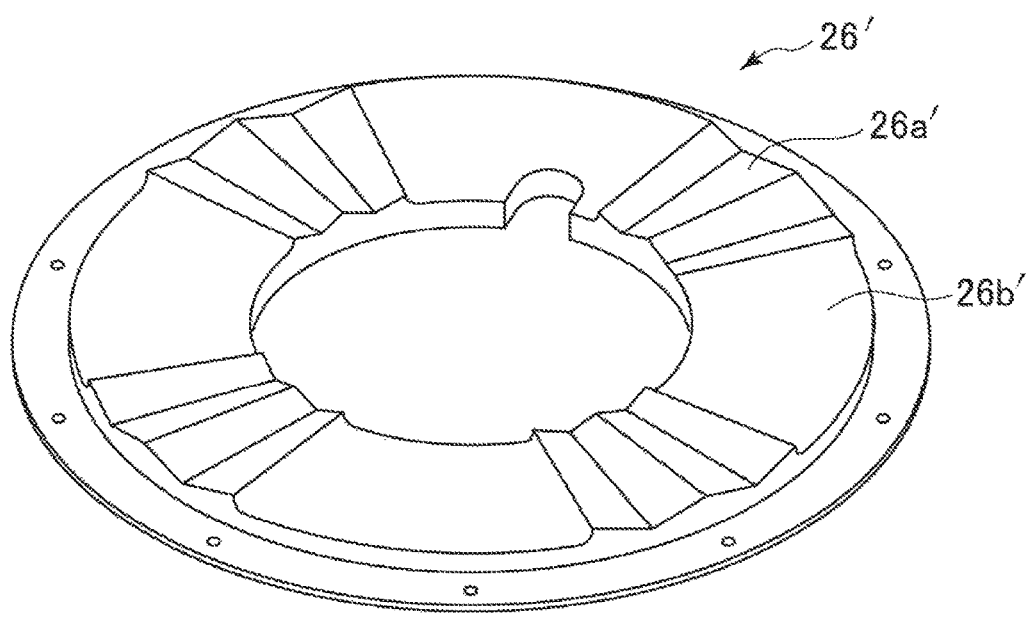
FIG. 22 is a plan view illustrating an example of an upper reflector of the epitaxial growth apparatus according to the related art.

FIG. 17 is a perspective view illustrating an example of the upper reflector 26 according to the embodiment of the present invention. As shown in drawing, the upper reflector 26 includes slope portions 26a reflecting hear waves from the heating means 23 to the center of the reaction chamber 2 and flat portions 26b reflecting heat waves from the heating means 23 in the vertically-falling direction. On the other hand, FIG. 22 is a perspective view illustrating an example of the upper reflector 26' in the epitaxial growth apparatus according to the related art. As shown in the drawing, the upper reflector 26' in the related art includes slope portions 26a' and flat portions 26b', but is different from the upper reflector 26 according to the embodiment of the present invention in the arrangement of the slope portions 26a. Specifically, the upper reflector 26 according to the embodiment of the present invention has an arrangement in which a slope portion is added to the center of a flat portion 26b' of the upper reflector 26' in the related art. In this way, by arranging the slope portions 26a and the flat portions 26b so that the area ratio of the slope portions 26a and the flat portions 26b is a predetermined ratio and the distribution of the slope portions 26a and the flat portions 26b is not biased, the uniformization of the temperature distribution of the substrate W is achieved.

Figure 18:
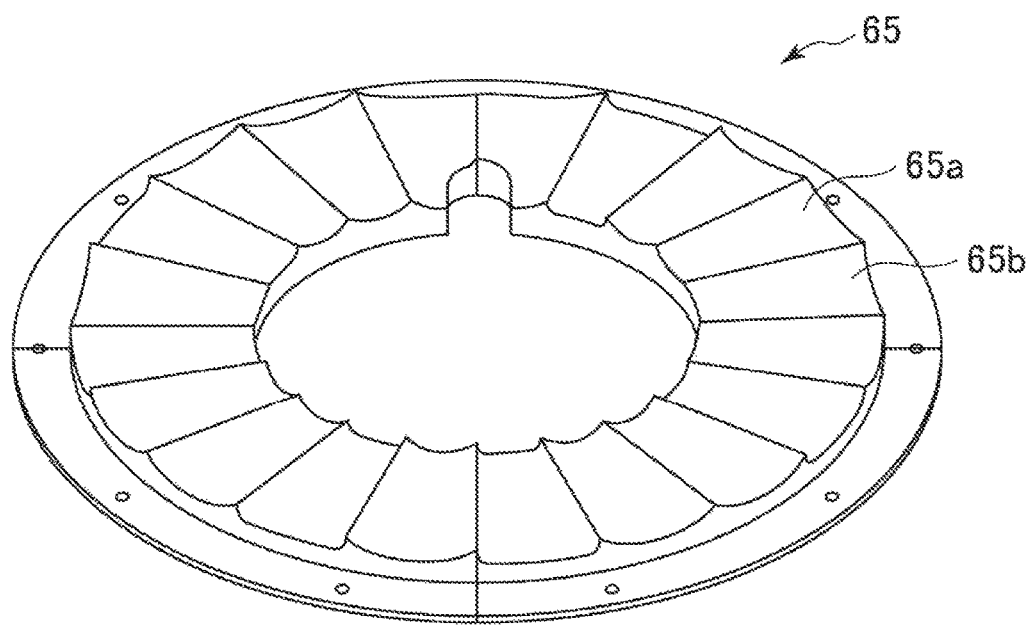
FIG. 18 is a plan view illustrating an example of a lower reflector according to the embodiment of the present invention.
Figure 23:
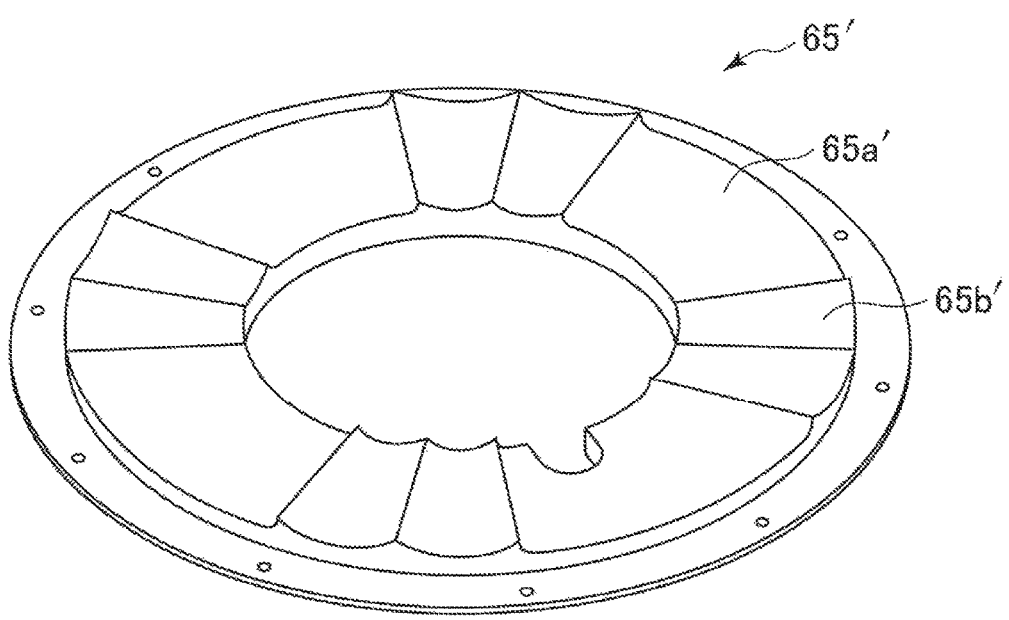
FIG. 23 is a plan view illustrating an example of a lower reflector of the epitaxial growth apparatus according to the related art.

FIG. 18 is a perspective view illustrating an example of the lower reflector 65 according to the embodiment of the present invention. FIG. 23 is a perspective view illustrating an example of the lower reflector 65' in the epitaxial growth apparatus according to the related art. Similarly to the upper reflector 26, the lower reflector 65 includes slope portions 65a reflecting heat waves from the heating means 62 to the center of the reaction chamber 2 and flat portions 65b reflecting heat waves from the heating means 62 in the vertically-rising direction, and has an arrangement in which a slope portion is added to the center of a flat portion 65b' of the lower reflector 65' according to the related art. In this way, by arranging the slope portions 65a and the flat portions 65b so that the area ratio of the slope portions 65a and the flat portions 65b is a predetermined ratio and the distribution of the slope portions 65a and the flat portions 65b is not biased, the uniformization of the temperature distribution of the substrate W is achieved.

In the epitaxial growth apparatus according to this embodiment, since the support 22 supports the ceiling plate 21, the distance H between the ceiling surface of the central portion of the ceiling surface of the central portion of the ceiling plate 21 facing the reaction chamber and the substrate W can be set to be less than 10 mm. Accordingly, the epitaxial growth apparatus 1 according to this embodiment can prevent the boundary layer formed by the reactant gas flowing between the ceiling plate 21 and the susceptor 3 from spreading toward the ceiling and thus the boundary layer is narrowed. Then, since the gas flow rate in the boundary layer increases, the gas density increases as a result and it is thus possible to enhance the reaction efficiency on the surface of the substrate W. Accordingly, in the epitaxial growth apparatus 1, it is possible to enhance the growth rate.

In the embodiment of the present invention, the distance H between the ceiling plate 21 and the substrate W is less than 10 mm, and it is preferable that the distance H between the ceiling plate 21 and the substrate W be less than 10 mm and the distance from the film formed on the substrate W to the ceiling plate 21 be equal to or more than 1 mm. By setting this range, it is possible to smooth the gas flow of the reactant gas while forming the boundary layer.

That is, in the reaction chamber 2 of this embodiment, by setting the distance between the substrate W and the ceiling plate 21 to be smaller than that in the related art (about 20 mm in the related art), it is possible to narrow the boundary layer to enhance the reaction efficiency on the surface of the substrate and thus to raise the growth rate.

EXAMPLES

The invention will be described below in detail with reference to examples.

Example 1

Epitaxial growth was carried out under the following growth conditions by the use of an epitaxial growth apparatus 1A (in which the distance H between the surface the substrate W and the ceiling plate 21 is 9.27 mm) employing the susceptor ring shown in FIG. 10.

Amount of first source gas (trichlorosilane): 8.5 SLM
Amount of purge gas (hydrogen): 15.0 SLM
Growth time: 600.0 seconds
Growth temperature: 1100.0° C.
Rotation speed: 20.0 RPM

Example 2

Epitaxial growth was carried out under the same conditions as in Example 1, except that the amount of the first source gas was changed to 13.5 SLM.

Example 3

Epitaxial growth was carried out under the same conditions as in Example 1, except that the amount of the first source gas was changed to 17.0 SLM.

Comparative Example 1

Epitaxial growth was carried out under the same conditions as in Example 1 using an epitaxial growth apparatus (in which the distance H between the surface of a substrate W and the ceiling plate 21 was 20 mm, there was no groove 75, and the susceptor ring was formed of a single member) according to the related art, except the rotation speed was changed to 35.0 RPM.

Comparative Example 2

Epitaxial growth was carried out under the same conditions as in Example 2 using an epitaxial growth apparatus (in which the distance H between the surface of a substrate W and the ceiling plate 21 was 20 mm, there was no groove 75, and the susceptor ring was formed of a single member) according to the related art, except the rotation speed was changed to 35.0 RPM.

Comparative Example 3

Epitaxial growth was carried out under the same conditions as in Example 3 using an epitaxial growth apparatus (in which the distance H between the surface of a substrate W and the ceiling plate 21 was 20 mm, there was no groove 75, and the susceptor ring was formed of a single member) according to the related art, except the rotation speed was changed to 35.0 RPM.

The film growth rate in the examples and the comparative examples was detected. The relationship between the detected growth rates and the first source gas is shown in FIG. 19.

Figure 19:
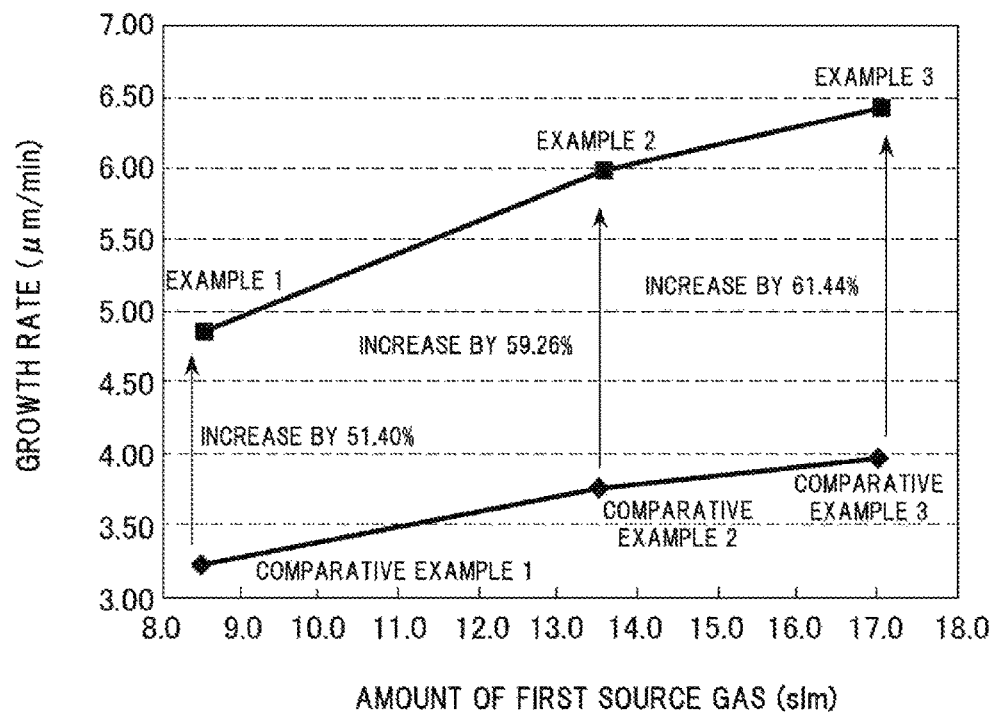
FIG. 19 is a graph illustrating results of examples and comparative examples.

As shown in FIG. 19, by employing the epitaxial growth apparatus 1A according to the embodiment of the present invention, the growth rate was improved by 50% and the improvement of the growth rate increased when the amount of the first source gas increased. Therefore, the growth rate was enhanced by using the epitaxial growth apparatus according to this embodiment.

What is claimed is:

1. A ceiling portion for use in a processing apparatus, the ceiling portion comprising:
   a ring shaped support, the ring shaped support comprising:
      a body having a top surface, and a bottom surface; and
      a protrusion protruding downward and inward from the bottom surface of the body, the protrusion having a first slope portion and a second slope portion, the first slope portion being part of the inner surface of the ring shaped support, wherein the first and second sloped portions decrease in diameter towards a center of the ring shaped support; and
   a ceiling plate coupled to the protrusion of the ring shaped support.

2. The ceiling portion of claim 1, wherein the ceiling plate is fixed to the inner surface of the ring shaped support.

3. The ceiling portion of claim 1, wherein a circumferential edge of the protrusion supports the ceiling plate at a circumferential edge of the ceiling plate.

4. The ceiling portion of claim 1, wherein the ceiling plate is made from a light permeable material.

5. The ceiling portion of claim 1, wherein the first slope portion and the second slope portion meet at the ceiling plate.

6. The ceiling portion of claim 5, wherein an angle formed by the first slope portion and the second slope portion is less than 90 degrees.

7. The ceiling portion of claim 1, wherein the ceiling plate is configured to absorb radiant heat.

8. A ceiling portion for use in a processing apparatus, the ceiling portion comprising:
   a ring shaped support, the ring shaped support comprising:
      a body having a top surface and a bottom surface; and
      a protrusion protruding downward and inward from the bottom surface the protrusion having a first slope portion and a second slope portion, the first slope portion being part of the inner surface of the ring shaped support and wherein the first slope portion and the second slope portion meet at an inner edge, wherein an angle formed by the first slope portion and the second slope portion is less than 90 degrees; and
   a ceiling plate coupled to the protrusion of the ring shaped support.

9. The ceiling portion of claim 8, wherein the ceiling plate is fixed to the inner surface of the ring shaped support.

10. The ceiling portion of claim 8, wherein a circumferential edge of the protrusion supports the ceiling plate at a circumferential edge of the ceiling plate.

11. The ceiling portion of claim 8, wherein the ceiling plate is made of a light permeable material.

12. The ceiling portion of claim 8, wherein the first slope portion and the second slope portion meet at the ceiling plate.

13. The ceiling portion of claim 8, wherein the ceiling plate is configured to absorb radiant heat.

* * * * *